US012621974B2

(12) United States Patent
Yeh et al.

(10) Patent No.: US 12,621,974 B2
(45) Date of Patent: May 5, 2026

(54) STATIC RANDOM ACCESS MEMORY AND ITS LAYOUT PATTERN

(71) Applicant: UNITED MICROELECTRONICS CORP., Hsin-Chu City (TW)

(72) Inventors: Shu-Wei Yeh, Taichung City (TW); Chang-Hung Chen, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 429 days.

(21) Appl. No.: 17/994,381

(22) Filed: Nov. 27, 2022

(65) Prior Publication Data

US 2024/0147683 A1    May 2, 2024

(30) Foreign Application Priority Data

Oct. 28, 2022    (TW) ................................. 111141074

(51) Int. Cl.
| | |
|---|---|
| *H10B 10/00* | (2023.01) |
| *G11C 17/16* | (2006.01) |
| *H01L 23/525* | (2006.01) |
| *H10B 20/25* | (2023.01) |
| *H10W 20/49* | (2026.01) |

(52) U.S. Cl.
CPC ........... *H10B 10/12* (2023.02); *G11C 17/165* (2013.01); *H10B 20/25* (2023.02); *H10W 20/491* (2026.01); *G11C 2229/763* (2013.01)

(58) Field of Classification Search
CPC ..... H10B 10/12; H10B 10/25; H01L 23/5252; G11C 17/165; G11C 2229/763
See application file for complete search history.

(56) References Cited

U.S. PATENT DOCUMENTS

| | | | |
|---|---|---|---|
| 7,525,868 B2 | 4/2009 | Liaw | |
| 8,144,540 B2 | 3/2012 | Liaw | |
| 8,908,409 B2 | 12/2014 | Huang | |
| 8,942,030 B2 | 1/2015 | Liaw | |
| 9,336,864 B2 | 5/2016 | Mojumder | |
| 9,542,996 B2 | 1/2017 | Thomas | |
| 2003/0185044 A1* | 10/2003 | Nii | H10B 10/12 |
| | | | 365/154 |
| 2013/0083591 A1 | 4/2013 | Wuu | |
| 2013/0341723 A1 | 12/2013 | Mojumder | |
| 2017/0243861 A1* | 8/2017 | Wang | G03F 1/36 |

(Continued)

*Primary Examiner* — Zandra V Smith
*Assistant Examiner* — Douglas Yap
(74) *Attorney, Agent, or Firm* — Winston Hsu

(57) ABSTRACT

The invention provides a layout pattern of static random access memory, which comprises a plurality of fin structures on a substrate, a plurality of gate structures on the substrate and spanning the fin structures to form a plurality of transistors distributed on the substrate. The transistors include a first pull-up transistor (PU1), a first pull-down transistor (PD1), a second pull-up transistor (PU2) and a second pull-down transistor (PD2), a first access transistor (PG1), a second access transistor (PG2), a first read port transistor (RPD) and a second read port transistor (RPG). The gate structure of the first read port transistor (RPD) is connected to the gate structure of the first pull-down transistor (PD1), wherein a drain of the first pull-down transistor (PD1) is connected to a first voltage source Vss1, and a drain of the first read port transistor (RPD) is connected to a second voltage source Vss2.

13 Claims, 4 Drawing Sheets

(56) References Cited

U.S. PATENT DOCUMENTS

| 2018/0366469 A1* | 12/2018 | Hsu | H10D 84/853 |
| 2019/0006372 A1* | 1/2019 | Lu | H10D 64/021 |
| 2020/0219558 A1 | 7/2020 | Siddiqui | |
| 2024/0040763 A1* | 2/2024 | Liaw | H10D 30/6735 |
| 2024/0096383 A1* | 3/2024 | Liaw | G11C 7/1069 |

* cited by examiner

STATIC RANDOM ACCESS MEMORY AND ITS LAYOUT PATTERN

BACKGROUND OF THE INVENTION

1. Field of the Invention

The present invention relates to a static random access memory (SRAM), in particular to a layout pattern of SRAM with high reading rate and high stability.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

SUMMARY OF THE INVENTION

The invention provides a layout pattern of static random access memory, which at least comprises a substrate, a plurality of fin structures on the substrate, a plurality of gate structures on the substrate and spanning the plurality of fin structures, so as to form a plurality of transistors distributed on the substrate, wherein each transistor comprises a part of the gate structures spanning the part of the fin structures, and the plurality of transistors comprise: a first pull-up transistor (PU1), a first pull-down transistor (PD1), a second pull-up transistor (PU2) and a second pull-down transistor (PD2) together form a latch circuit, a first access transistor (PG1) and a second access transistor (PG2) are connected to the latch circuit, and a first read port transistor (RPD) and a second read port transistor (RPG) connected in series, wherein the gate structure of the first read port transistor (RPD) is connected to the gate structure of the first pull-down transistor (PD1), wherein a drain of the first pull-down transistor (PD1) is connected to a first voltage source, and a drain of the first read port transistor (RPD) is connected to a second voltage source.

The present invention also provides a static random access memory, which at least comprises a plurality of transistors distributed on a substrate, wherein the plurality of transistors comprise a first pull-up transistor (PU1), a first pull-down transistor (PD1), a second pull-up transistor (PU2) and a second pull-down transistor (PD2) to form a latch circuit. a first access transistor (PG1) and a second access transistor (PG2) connected to the latch circuit, and a first read port transistor (RPD) and a second read port transistor (RPG) connected in series, wherein the gate structure of the first read port transistor (RPD) is connected to the gate structure of the first pull-down transistor (PD1), wherein a drain of the first pull-down transistor (PD1) and a drain of the second pull-down transistor (PD2) are connected to a first voltage source Vss1, and a drain of the first read port transistor (RPD) is connected to a second voltage source Vss2.

The present invention is characterized in that, in conventional SRAM, a drain of the first pull-down transistor (PD1), a drain of the second pull-down transistor (PD2) and a drain of the first read port transistor (RPD) are commonly connected to a voltage source (Vss). However, in the present invention, a drain of the first pull-down transistor (PD1) and a drain of the second pull-down transistor (PD2) are connected to a first voltage source (Vss1), and a drain of the first read port transistor (RPD) is connected to a second voltage source (Vss2), that is, the first voltage source Vss1 and the second voltage source Vss2 are independent of each other. When the reading state is performed, the voltage of Vss2 can be independently lowered (for example, to a negative potential), which can increase the reading speed without affecting the stability of the latch circuit. On the other hand, when the SRAM is on standby state, it is also possible to increase the voltage of Vss2 (for example, to a positive potential), which can reduce the occurrence probability of leakage current and improve the stability of SRAM. The invention has the advantages of improving the quality and stability of components, and being compatible with the existing manufacturing process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
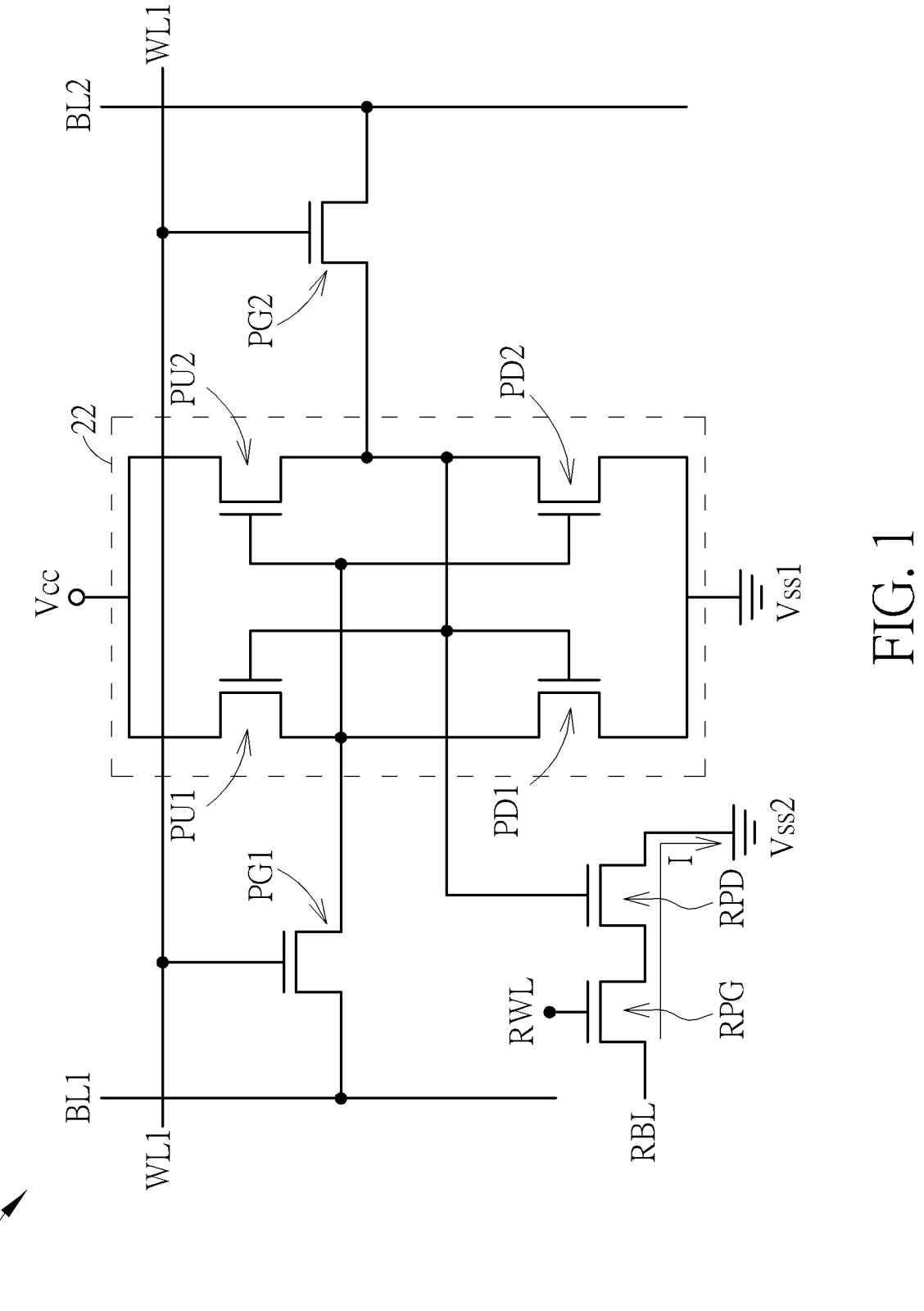
FIG. 1 is a circuit diagram of a SRAM memory cell in a SRAM according to the first embodiment of the present invention.
Figure 2:
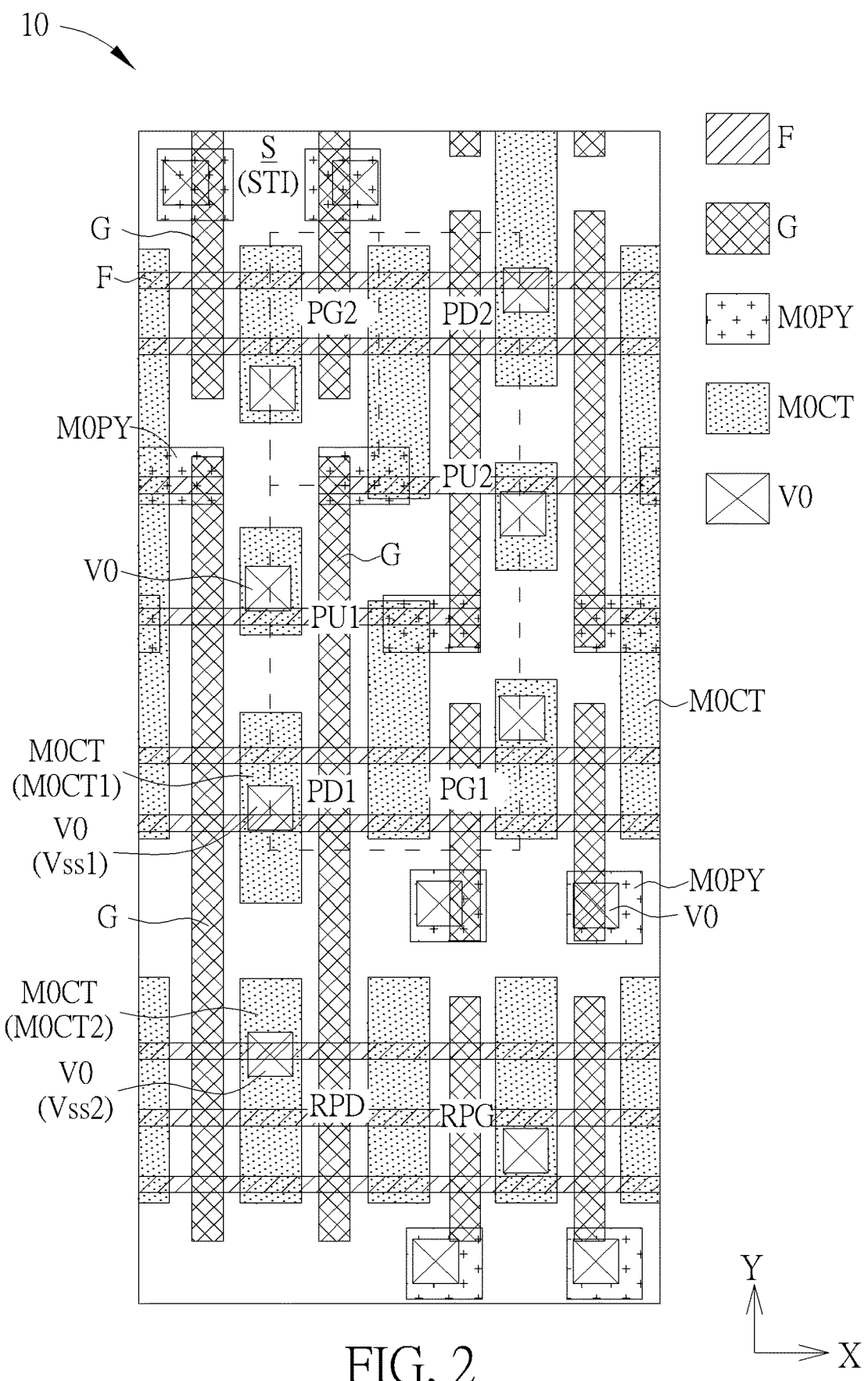
FIG. 2 is a layout diagram of a static random access memory according to the first preferred embodiment of the present invention.

Please refer to FIG. 1 and FIG. 2. FIG. 1 is a circuit diagram of a SRAM memory cell according to the first embodiment of the present invention. FIG. 2 is a layout diagram of a static random access memory according to the first preferred embodiment of the present invention.

In this embodiment, at least one 8-transistor register file SRAM (8TRF-SRAM) memory cell 10 is included. The 8TRF-SRAM memory cell 10 is preferably composed of a first pull-up transistor PU1, a second pull-up transistor PU2, a first pull-down transistor PD1, a second pull-down transistor PD2, a first access transistor PG1, a second access transistor PG2, a first read port transistor RPG and a second read port transistor RPD, wherein the first read port transistor RPG and the second read port transistor RPD are connected in series. The first pull-up transistor PU1 and the second pull-up transistor PU2, the first pull-down transistor PD1 and the second pull-down transistor PD2 form a latch circuit 22, so that data can be latched at a storage node. In addition, in this embodiment, a source of the first pull-up transistor PU1 and a source of the second pull-up transistor PU2 are electrically connected to a voltage source Vcc, and a drain of the first pull-down transistor PD1 and a drain of the second pull-down transistor PD2 are electrically connected to a first voltage source Vss1.

A gate of the first access transistor PG1 and a gate of the second access transistor PG2 are coupled to the word line WL1, and a source (S) of the first access transistor PG1 and a source of the second access transistor PG2 are respectively coupled to the corresponding first bit line BL1 and second bit line BL2. In addition, the gate of the read port transistor RPG is connected to a read word line RWL, the source of the read port transistor RPG is connected to a read bit line RBL, the gate of the read port transistor RPD is connected to the latch circuit 22, and the drain of the read port transistor RPD is connected to a second voltage source Vss2.

In the conventional technology, the drain of the first pull-down transistor PD1, the drain of the second pull-down transistor PD2 and the drain of the read port transistor RPD are commonly connected to a voltage source (for example, Vss). However, in the present invention, the drain of the first pull-down transistor PD1 and the drain of the second pull-down transistor PD2 are connected to the first voltage source Vss1, and the drain of the read port transistor RPD is connected to the second voltage source Vss2. The applicant found that the conventional structure still needs to be improved. The reason is that when the 8TRF-SRAM memory cell 10 performs the reading state, the read bit line RBL keeps a high potential, while the potential of the drain terminal of the read port transistor RPD (or Vss2 for short) is low. At this time, a current I will be generated from the read bit line RBL to the drain of the read port transistor RPD. When the potential difference between the read bit line RBL and the drain of the read transistor RPD is larger, the generated current I will also increase, which is beneficial to improve the read rate of the 8TRF-SRAM memory cell 10. The way to increase the potential difference mentioned above is to give the drain of the reading transistor RPD a negative potential (for example, setting the terminal of Vss2 to −0.5V).

However, in the conventional 8TRF-SRAM memory cell (that is, the drain of the first pull-down transistor PD1, the drain of the second pull-down transistor PD2, and the drain of the read port transistor RPD are all connected to a voltage source), the Vss1 terminal (that is, the drain of the first pull-down transistor PD1 and the drain of the second pull-down transistor PD2) and the Vss2 terminal (that is, the drain of the read port transistor RPD) are substantially electrically connected to each other. If a negative potential is given to the Vss2 terminal, the Vss1 terminal will also become negative, which means that the potential of the Vss1 terminal and the Vss2 terminal must be the same. At this time, the Vss1 terminal with low potential will affect the stability of the latch circuit 22. For example, due to the unexpected low potential of Vss1, the latch circuit 22 may generate additional leakage current to Vss2, which may even affect the potential change of internal transistors, resulting in the loss of stored data.

Therefore, in the conventional 8TRF-SRAM memory cell, the potential of Vss cannot be arbitrarily lowered, otherwise, although the reading speed may be increased, it also brings the risk of data loss.

The invention is characterized in that the Vss1 terminal and the Vss2 terminal are made separately, and they are not electrically connected with each other, so that the Vss1 terminal and the Vss2 terminal can be electrically independent. When the 8TRF-SRAM memory cell is in the reading state, the negative potential can be set to the Vss2 terminal, while the Vss1 terminal maintains the original potential (for example, 0V). In this way, the reading speed of the 8TRF-SRAM memory cell can be improved, and no extra leakage current will be generated in the latch circuit 22, which will affect the storage efficiency of the 8TRF-SRAM memory cell.

To achieve the above purpose, the layout pattern of 8TRF-SRAM memory cells can be improved. FIG. 2 is a layout diagram of a static random access memory according to the first preferred embodiment of the present invention. In this embodiment, as shown in FIG. 2, the 8TRF-SRAM memory cell 10 is disposed on a substrate S, such as a silicon substrate or a silicon-on-insulator (SOI) substrate. The substrate S may be a planar structure or provided with a plurality of fin structures F, and a plurality of gate structures G are disposed on the substrate S. In other embodiments of the present invention, it can also be applied to planar SRAM, which means that the doped regions are formed in the substrate instead of the fin structures, and it also belongs to the scope of the present invention.

In addition, the layout of FIG. 2 also includes a plurality of metal layers, where the metal layers partially connecting the gates of each transistor is defined as M0PY, and the metal layers connecting the source/drain of each transistor is defined as M0CT. In FIG. 2, the metal layer M0PY and the metal layer M0CT are represented by different shading. However, the difference between the metal layer M0PY and the metal layer M0CT is that the connected components are different, and both of them actually belong to metal layers and can contain the same material, but they are not limited to this. FIG. 2 also includes a plurality of contact plugs (via)V0, wherein the contact plugs V0 are used to connect the metal layers M0PY and M0CT to other conductive layers (such as M1, V1, M2, etc., which are common in semiconductor manufacturing processes) formed subsequently.

In the layout pattern of the present invention, a three-dimensional SRAM is taken as an example (that is, fin structures F are formed instead of planar doped regions). As shown in FIG. 2, except the fin structure F, the gate structure G, the connecting structure M0PY, the connecting structure M0CT and the position of the contact V0 are formed on the substrate S, the rest of the substrate S is covered with an insulating layer, such as a shallow trench isolation (STI), to isolate various electronic components (such as transistors) and avoid short circuit. In addition, each gate structure G spans (crosses) part of the fin structure F to form transistors (such as the first pull-up transistor PU1, the second pull-up transistor PU2, the first pull-down transistor PD1, the second pull-down transistor PD2, the first access transistor PG1, the second access transistor PG2, the read port transistor RPG and the read port transistor RPD). For clarity of the drawing, the positions of the above transistors are directly marked on the second drawing, especially at the intersection of the gate structure G and the fin structure F.

In the layout diagram of this embodiment, the drain of the first pull-down transistor PD1 is electrically connected to a metal layer M0CT, while the drain of the read port transistor RPD is electrically connected to another M0CT. Here, the drain electrically connected to the first pull-down transistor PD1 is defined as the metal layer M0CT1, and the drain electrically connected to the read port transistor RPD is defined as the metal layer M0CT2 for the convenience of identifying the two. The metal layer M0CT1 and the metal layer M0CT2 are not electrically connected to each other. From the layout of FIG. 2, it can be found that the metal layers M0CT1 and M0CT2 are arranged in the same direction (for example, arranged and aligned along the Y direction of FIG. 2), but the metal layers M0CT1 and M0CT2 are not in direct contact with each other. The metal layer M0CT1 can be separated from the metal layer M0CT2 by changing the mask during the manufacturing process.

In addition, the metal layer M0CT1 is electrically connected to the first voltage source Vss1 through the contact plug V0, and the metal layer M0CT2 is electrically connected to the second voltage source Vss2 through the contact plug V0. As mentioned above, the first voltage source Vss1 and the second voltage source Vss2 are independent of each other. Therefore, the potential of the second voltage source Vss2 can be independently adjusted, and the effect of accelerating the reading speed of the 8TRF-SRAM memory cell can be achieved without affecting the first voltage source Vss1.

Figure 3:
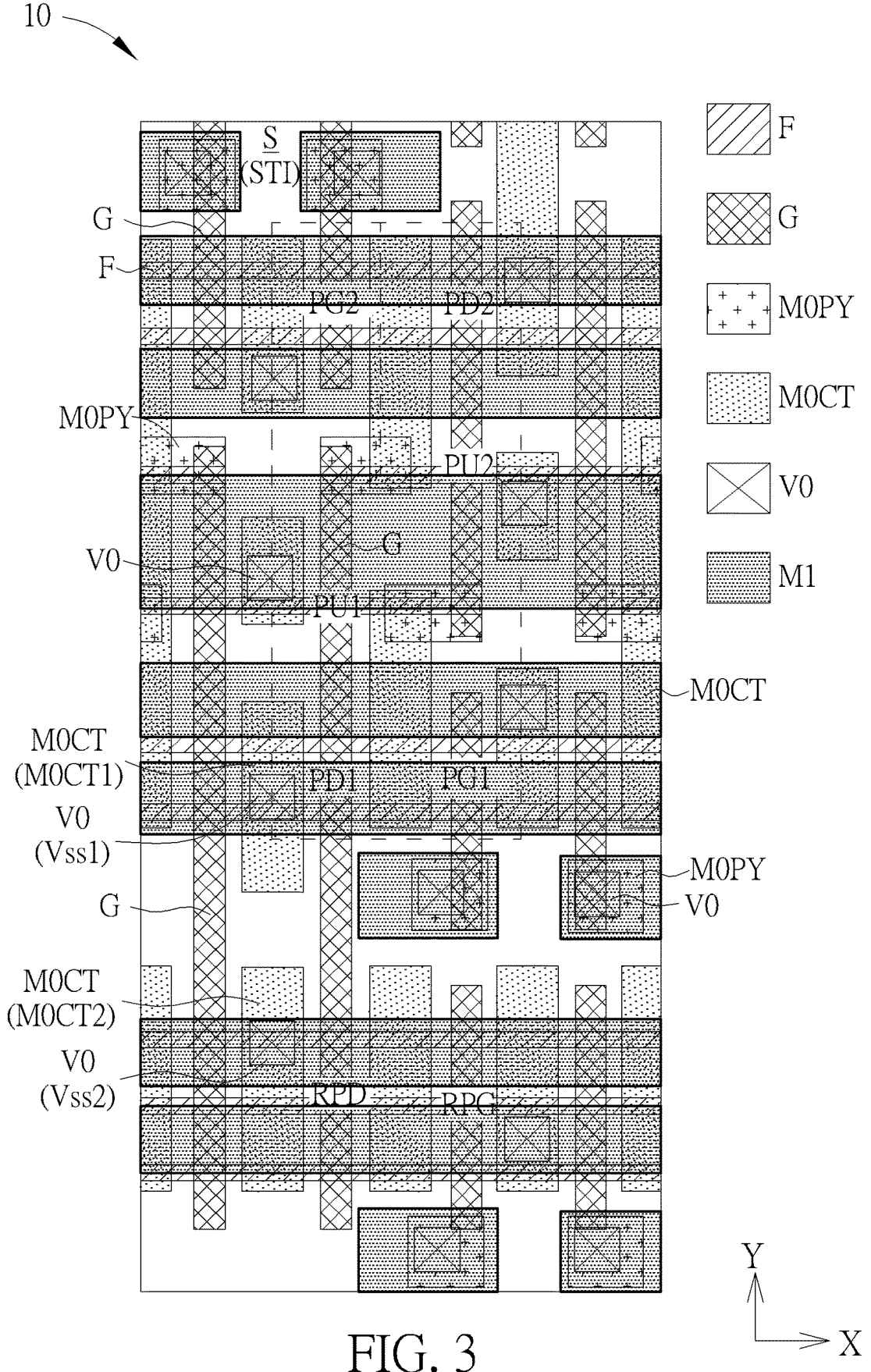
FIG. 3 is a layout diagram of the SRAM of FIG. 2 after the first metal layer M1 is formed.

After the metal layer M0CT1, the metal layer M0CT2 and the contact plug V0 are completed, other conductive layers can be continuously formed. For example, refer to FIG. 3, which shows the layout of the SRAM of FIG. 2 after the first metal layer M1 is formed. As shown in FIG. 3, a metal layer M1 is formed, and the above elements are connected to other electronic elements to be formed later. Notably, the metal layer M1 connecting the metal layer M0CT1 is separated from the metal layer M1 connecting the metal layer M0CT2, so as to ensure that the metal layer M0CT1 and the metal layer M0CT2 can be connected to different voltage sources in the subsequent steps. After the metal layer M1 is formed, other metal layers (such as V1, M2, etc., which are common in semiconductor manufacturing processes) may be formed in the subsequent steps. As these technologies belong to the conventional technologies in the field, they will not be described in detail here.

Figure 4:
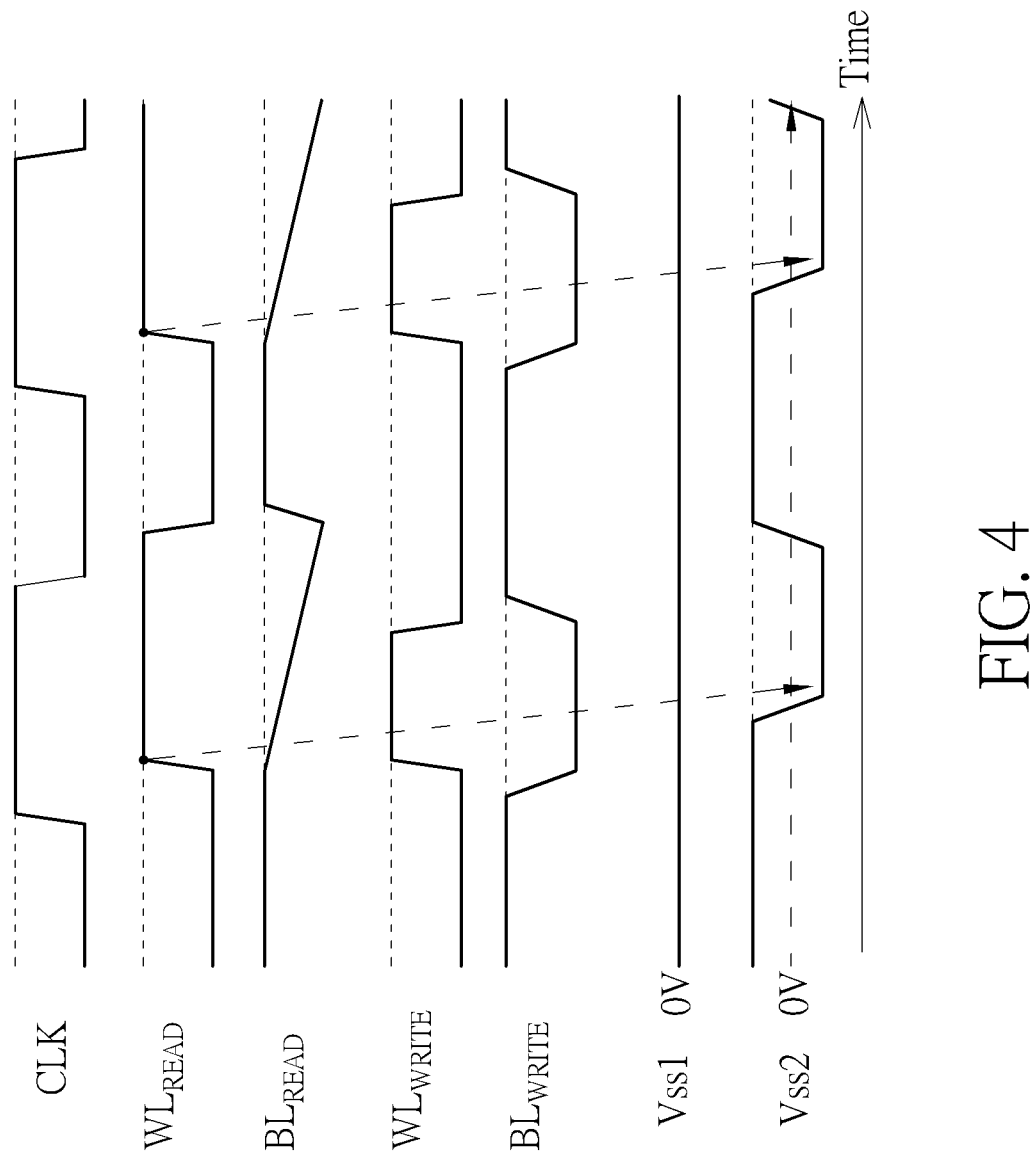
FIG. 4 is a timing chart showing the operation of the 8TRF-SRAM memory cell of the present invention.

The timing chart of the operation of the 8TRF-SRAM memory cell of the present invention is shown in FIG. 4, in which CLK represents the clock, WLREAD represents the time sequence of word line reading, BLREAD represents the time sequence of word line writing, BL WLWIRTE represents the time sequence of bit line writing, and Vss2 represents the potential (greater than or less than 0V) of Vss2 at this time sequence. Mainly refer to the relationship between the two rows of 8TRF-SRAM memory cell when reading (WLREAD) and Vss2. It can be found from FIG. 3 that when the 8TRF-SRAM memory cell is not read, that is, when the WLREAD row indicates 0, the corresponding Vss2 is at a high potential (that is, greater than 0V), while when the WLREAD row indicates 1, after half a clock, the corresponding Vss2 falls to a low potential (that is, less than 0V). In other words, in the present invention, when the 8TRF-SRAM memory cell is in a standby state, the potential connected to the second voltage source Vss2 is higher than the potential connected to the first voltage source Vss1 (usually the first voltage source Vss1 is set to 0V), while when the 8TRF-SRAM memory cell is in a reading state, the potential connected to the second voltage source Vss2 is lower than the potential connected to the first voltage source Vss1. In this way, the above efficiency of increasing the reading rate of the 8TRF-SRAM memory cell can be achieved. In addition, when the 8TRF-SRAM memory cell is in standby state, setting the second voltage source Vss2 to a high potential can also avoid unnecessary leakage current and increase the stability of the structure.

According to the above description and drawings, the present invention provides a layout pattern of SRAM, which comprises at least a substrate S, a plurality of fin structures F located on the substrate S, a plurality of gate structures G located on the substrate and spanning the plurality of fin structures F, so as to form a plurality of transistors distributed on the substrate S, wherein each transistor includes a portion of gate structures G spanning the portion of fin structures F, The transistors include a first pull-up transistor (PU1), a first pull-down transistor (PD1), a second pull-up transistor (PU2) and a second pull-down transistor (PD2), which together form a latch circuit, and a first access transistor (PG1) and a second access transistor (PG2) are connected to the latch circuit. And a first read port transistor (RPD) and a second read port transistor (RPG) connected in series, wherein the gate structure of the first read port transistor (RPD) is connected to the gate structure of the first pull-down transistor (PD1), wherein a drain of the first pull-down transistor (PD1) is connected to a first voltage source Vss1, and a drain of the first read port transistor (RPD) is connected to a second voltage Vss2.

In some embodiments of the present invention, a plurality of fin structures F are arranged along a first direction (X direction) and a plurality of gate structures G are arranged along a second direction (Y direction), and the first direction and the second direction are perpendicular to each other.

In some embodiments of the present invention, the first read port transistor (RPD), the first pull-up transistor (PU1), the first pull-down transistor (PD1) and the second access transistor (PG2) are arranged along the second direction (Y direction).

In some embodiments of the present invention, the second read port transistor (RPG), the second pull-up transistor (PU2), the second pull-down transistor (PD2) and the first access transistor (PG1) are arranged along a second direction (Y direction).

In some embodiments of the present invention, the first voltage source Vss1 and the second voltage source Vss2 are not electrically connected to each other.

In some embodiments of the present invention, the first voltage source is connected to a first metal layer (M0CT1) and the second voltage source is connected to a second metal layer (M0CT2), wherein the first metal layer is not in direct contact with the second metal layer, but is aligned along the second direction (Y direction).

In some embodiments of the present invention, the first read port transistor (RPD) and the second read port transistor (RPG) are aligned along the first direction (X direction).

In some embodiments of the present invention, the first metal layer (M0CT1) includes a first contact plug (the contact plug V0 on connecting metal layer M0CT1), and the second metal layer includes a second contact plug (contact plug V0 on connecting metal layer M0CT2).

The present invention also provides a static random access memory, which at least comprises a plurality of transistors distributed on a substrate S, wherein the plurality of transistors comprise a first pull-up transistor (PU1), a first pull-down transistor (PD1), a second pull-up transistor (PU2) and a second pull-down transistor (PD2), which together form a latch circuit. A first access transistor (PG1) and a second access transistor (PG2) connected to the latch circuit, and a first read port transistor (RPD) and a second read port transistor (RPG) connected in series, wherein the gate structure of the first read port transistor (RPD) is connected to the gate structure of the first pull-down transistor (PD1), wherein a drain of the first pull-down transistor (PD1) and a drain of the second pull-down transistor (PD2) are connected to a first voltage source Vss1, and a drain of the first read port transistor (RPD) is connected to a second voltage source Vss2.

In some embodiments of the present invention, the first voltage source Vss1 and the second voltage source Vss2 are not electrically connected to each other.

In some embodiments of the present invention, a source of the second read port transistor (RPG) is connected to a read bit line (RBL).

In some embodiments of the present invention, a gate of the second read port transistor (RPG) is connected to a read word line (RWL).

In some embodiments of the present invention, a source of the first pull-up transistor (PU1) and a source of the second pull-up transistor (PU2) are connected to a third voltage source (Vcc).

In some embodiments of the present invention, the gate of the first read port transistor (RPD) is connected with the gate of the first pull-up transistor (PU1) and the gate of the first pull-down transistor (PD1).

In some embodiments of the present invention, when the SRAM is in a reading state, a potential connected to the second voltage source Vss2 is lower than a potential connected to the first voltage source Vss1.

In some embodiments of the present invention, when the SRAM is in a standby state, a potential connected to the second voltage source Vss2 is higher than a potential connected to the first voltage source Vss1.

The present invention is characterized in that, in conventional SRAM, a drain of the first pull-down transistor (PD1), a drain of the second pull-down transistor (PD2) and a drain of the first read port transistor (RPD) are commonly connected to a voltage source (Vss). However, in the present invention, a drain of the first pull-down transistor (PD1) and a drain of the second pull-down transistor (PD2) are connected to a first voltage source (Vss1), and a drain of the first read port transistor (RPD) is connected to a second voltage source (Vss2), that is, the first voltage source Vss1 and the second voltage source Vss2 are independent of each other. When the reading state is performed, the voltage of Vss2 can be independently lowered (for example, to a negative potential), which can increase the reading speed without affecting the stability of the latch circuit. On the other hand, when the SRAM is on standby state, it is also possible to increase the voltage of Vss2 (for example, to a positive potential), which can reduce the occurrence probability of leakage current and improve the stability of SRAM. The invention has the advantages of improving the quality and stability of components, and being compatible with the existing manufacturing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of static random access memory (SRAM), at least comprising:
   a substrate;
   a plurality of fin structures positioned on the substrate;
   a plurality of gate structures located on the substrate and span the plurality of fin structures to form a plurality of transistors distributed on the substrate, wherein each transistor includes a part of the gate structure spans a part of the fin structure, wherein the transistors include:
   a first pull-up transistor (PU1), a first pull-down transistor (PD1), a second pull-up transistor (PU2) and a second pull-down transistor (PD2) form a latch circuit;
   a first access transistor (PG1) and a second access transistor (PG2) connected to the latch circuit; and
   a first read port transistor (RPD) and a second read port transistor (RPG) connected in series, wherein the gate structure of the first read port transistor (RPD) is connected to the gate structure of the first pull-down transistor (PD1), and wherein the first pull-down transistor (PD1) is disposed between the first pull-up transistor (PU1) and the first read port transistor (RPD);
   wherein a drain of the first pull-down transistor (PD1) is connected to a first voltage source Vss1, and a drain of the first read port transistor (RPD) is connected to a second voltage source Vss2, wherein the gate of the first read port transistor (RPD) directly contacts the gate of the first pull-up transistor (PU1) and the gate of the first pull-down transistor (PD1), wherein the first voltage source Vss1 is connected to a first metal layer, and the second voltage source Vss2 is connected to a second metal layer, wherein the first metal layer is not in direct contact with the second metal layer.

2. The layout pattern of static random access memory according to claim 1, wherein the fin structures are arranged along a first direction and the gate structures are arranged along a second direction, and the first direction and the second direction are perpendicular to each other.

3. The layout pattern of static random access memory according to claim 2, wherein the first read port transistor (RPD), the first pull-up transistor (PU1), the first pull-down transistor (PD1) and the second access transistor (PG2) are arranged along the second direction.

4. The layout pattern of static random access memory according to claim 2, wherein the second read port transistor (RPG), the second pull-up transistor (PU2), the second pull-down transistor (PD2) and the first access transistor (PG1) are arranged along the second direction.

5. The layout pattern of static random access memory according to claim 2, wherein the first voltage source Vss1 and the second voltage source Vss2 are not electrically connected to each other.

6. The layout pattern of static random access memory according to claim 5, wherein the first metal layer and the second metal layer are aligned along the second direction.

7. The layout pattern of static random access memory according to claim 6, wherein the first read port transistor (RPD) and the second read port transistor (RPG) are aligned along the first direction.

8. The layout pattern of static random access memory according to claim 6, wherein the first metal layer includes a first contact plug, and the second metal layer includes a second contact plug.

9. A static random access memory, at least comprising:
   a plurality of transistors distributed on a substrate, wherein the plurality of transistors comprising:
   a first pull-up transistor (PU1), a first pull-down transistor (PD1), a second pull-up transistor (PU2) and a second pull-down transistor (PD2) form a latch circuit;
   a first access transistor (PG1) and a second access transistor (PG2) connected to the latch circuit; and a first read port transistor (RPD) and a second read port transistor (RPG) connected in series, wherein the gate structure of the first read port transistor (RPD) is connected to the gate structure of the first pull-down transistor (PD1), and wherein the first pull-down transistor (PD1) is disposed between the first pull-up transistor (PU1) and the first read port transistor (RPD);

wherein a drain of the first pull-down transistor (PD1) and a drain of the second pull-down transistor (PD2) are connected to a first voltage source Vss1, and a drain of the first read port transistor (RPD) is connected to a second voltage source Vss2, wherein the gate of the first read port transistor (RPD) directly contacts the gate of the first pull-up transistor (PU1) and the gate of the first pull-down transistor (PD1), wherein the first voltage source Vss1 is connected to a first metal layer, and the second voltage source Vss2 is connected to a second metal layer, wherein the first metal layer is not in direct contact with the second metal layer.

10. The static random access memory according to claim 9, wherein the first voltage source Vss1 and the second voltage source Vss2 are not electrically connected to each other.

11. The static random access memory according to claim 9, wherein a source of the second read port transistor (RPG) is connected to a read bit line (RBL).

12. The static random access memory according to claim 9, wherein a gate of the second read port transistor (RPG) is connected to a read word line (RWL).

13. The static random access memory according to claim 9, wherein a source of the first pull-up transistor (PU1) and a source of the second pull-up transistor (PU2) are connected to a third voltage source Vcc.

* * * * *